(12) United States Patent
Lin et al.

(10) Patent No.: US 6,773,993 B2
(45) Date of Patent: Aug. 10, 2004

(54) METHOD FOR MANUFACTURING A SELF-ALIGNED SPLIT-GATE FLASH MEMORY CELL

(75) Inventors: Chi-Hui Lin, Taipei (TW); Chung-Lin Huang, Taichung (TW); Cheng-Chih Huang, Taipei Hsien (TW)

(73) Assignee: Nanya Technology Corporation (TW)

( * ) Notice: Subject to any disclaimer, the term of this patent is extended or adjusted under 35 U.S.C. 154(b) by 141 days.

(21) Appl. No.: 09/880,783

(22) Filed: Jun. 15, 2001

(65) Prior Publication Data

US 2002/0142543 A1 Oct. 3, 2002

(30) Foreign Application Priority Data

Apr. 3, 2001 (TW) ........................................ 90107932 A

(51) Int. Cl.[7] .............................................. H01L 21/336
(52) U.S. Cl. ....................... 438/267; 438/257; 438/259; 438/593; 438/596
(58) Field of Search ................................. 438/257, 259, 438/267, 299, 266, 593, 596

(56) References Cited

U.S. PATENT DOCUMENTS 5,461,249 A * 10/1995 Ozawa ........................ 257/321
5,910,912 A * 6/1999 Hsu et al. ............... 365/185.01
6,329,248 B1 * 12/2001 Yang ........................... 438/267

OTHER PUBLICATIONS

Wolf et al., Silicon Processing for the VLSI Era: vol. 1: Process Technology; Lattice Press, copyright 1986, Pp. 282, 532,533.*
Wolf et al., Silicon Processing for the VLSI Era, Polume 3, The Submicron MOSFET; Lattice Press, copyright 1995, Pp.595,596.*

* cited by examiner

Primary Examiner—George Eckert
Assistant Examiner—N. Drew Richards
(74) Attorney, Agent, or Firm—Birch, Stewart, Kolasch & Birch, LLP.

(57) ABSTRACT

A method for manufacturing a split-gate flash memory cell, comprising the steps of forming an active region on a semiconductor substrate; forming a buffer layer on the semiconductor substrate; forming a first dielectric layer on the buffer layer; removing part of the first dielectric layer; defining an opening; removing the buffer layer within the opening; forming a gate insulating layer and floating gates; forming a source region in the semiconductor substrate; depositing a conformal second dielectric layer on the opening; removing the buffer layer outside the first dielectric layer and the floating gates; and forming an oxide layer and control gates.

19 Claims, 6 Drawing Sheets

METHOD FOR MANUFACTURING A SELF-ALIGNED SPLIT-GATE FLASH MEMORY CELL

BACKGROUND OF THE INVENTION

1. Field of the Invention

The present invention relates in general to a method for manufacturing flash memory integrated circuits, and more particularly to a method for manufacturing a self-aligned split-gate flash memory cell.

2. Description of the Prior Art

Conventional Erasable and Programmable Read-Only Memory (EPROM) devices have memory cells which comprise floating-gate transistors. A wide variety of EPROM is available. One form of EPROM is a flash EPROM.

Conventional flash memory devices have a split-gate structure comprised of one floating gate and one control gate. To form the floating and control gates, flash memory cells, however, are often bulky and have complex geometries of multiple gate layers. Therefore, it is difficult to fabricate a split-gate structure in a desired memory cell space.

Referring to FIG. 1, the conventional split-gate flash memory cell has a structure wherein the source/drain regions 11 and 12 are formed in a semiconductor substrate 10, a gate insulating film 13 is formed on the substrate 10, a floating gate 14 is formed on the gate insulating film 13, and a control gate 16 is formed on the floating gate 14. The control gate 16 and the floating gate 14 are insulated from each other by a dielectric film 15, and the split gate of the flash memory cell is thus made.

The floating gate 14 is defined by the photolithographic process known to one of ordinary skill in the art. Unfortunately, it is often difficult to self-align and requires a larger size of memory cell. In addition, the channel length of the control gate 16 is determined during the process of forming the floating gate 14. In this connection, in the case where a misalignment of a mask occurs during the photolithographic process forming the floating gate 14, a desired channel length of the control gate 16 cannot be readily obtained.

FIGS. 2A to 2E illustrate the manufacturing sequences of a conventional split-gate flash memory device.

Referring to FIG. 2A, an insulating film 21 is formed on a semiconductor substrate 20 and is photo-etched to form openings 22. Using the insulating film 21 as an ion-implantation blocking mask, n⁺-type impurity ions are implanted into the semiconductor substrate 20, thereby forming source/drain regions 23 and 24.

As shown in FIG. 2B, after removing the insulating film 21, which serves as an ion-implantation blocking mask, a gate insulating film 25 is formed on the substrate 20. Then, a polysilicon film 26 is formed on the gate insulating film 25.

As shown in FIG. 2C, after coating the polysilicon film 26 with a photoresist film 27, a photomask is aligned on the photoresist film 27, and the polysilicon film 26 is photo-etched. As shown in FIG. 2D, floating gates 26' are thus formed.

As shown in FIG. 2E, a dielectric film 28 is formed on the surfaces of the floating gates 26', and a control gate 29 is formed over the entire surface of the substrate 20, thereby obtaining the control split-gate flash memory device.

However, in a case where a photomask is misaligned, the channel length of the floating gates 26' is relatively increased or decreased. Therefore, the channel length of the split control gates 29 is decreased or increased.

SUMMARY OF THE INVENTION

It is therefore an object of the invention to provide a fixed space between the floating gates of the flash memory cell.

It is another object of the invention to provide the flash memory cell with a self-aligned split gate to reduce the size of the memory cell.

To achieve these objects and advantages, and in accordance with the purpose of the invention, as embodied and broadly described herein, the invention is directed towards a method for manufacturing a split-gate flash memory cell, comprising the steps of forming an active region on a semiconductor substrate; forming a buffer layer on the semiconductor substrate; forming a first dielectric layer on the buffer layer; removing part of the first dielectric layer; defining an opening; removing the buffer layer within the opening; forming a gate insulating layer and floating gates; forming a source region in the semiconductor substrate; depositing a conformal second dielectric layer on the opening; removing the buffer layer outside the first dielectric layer and the floating gates; and forming an oxide layer and control gates.

BRIEF DESCRIPTION OF THE DRAWINGS

These and other features and advantages of the present invention will be better understood by considering the following detailed description of the invention which is presented with the attached drawings.

FIG. 2, including

FIG. 3, including FIG. 4, including FIG. 4A and 4B, shows cross-section views depicting part of the steps of manufacturing a split-gate flash memory cell, according to another embodiment of the present invention.

DESCRIPTION OF THE PREFERRED EMBODIMENTS

Figure 1:
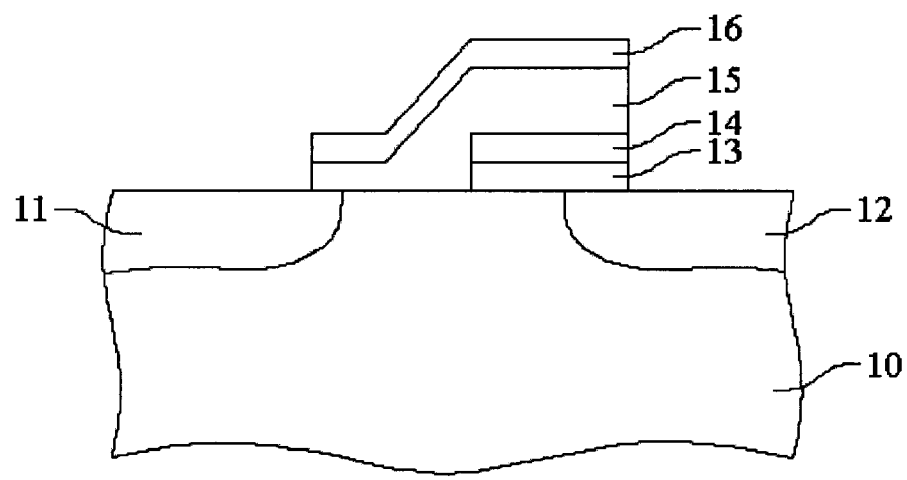
FIG. 1 is a cross-sectional view of a conventional split-gate flash memory cell.
Figure 2A:
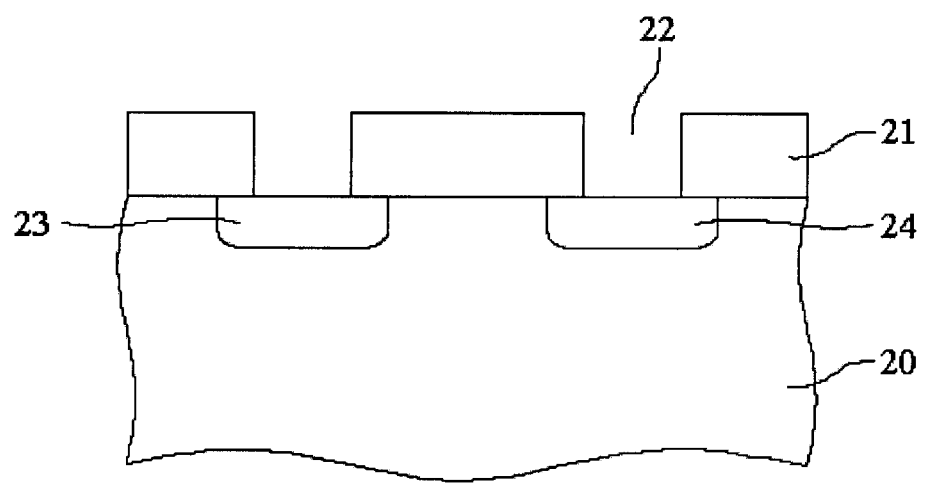
FIG. 2A, 2B, 2C, 2D, and 2E, shows cross-sectional views depicting the steps of manufacturing a flash memory device having a conventional split gate structure.
Figure 2B:
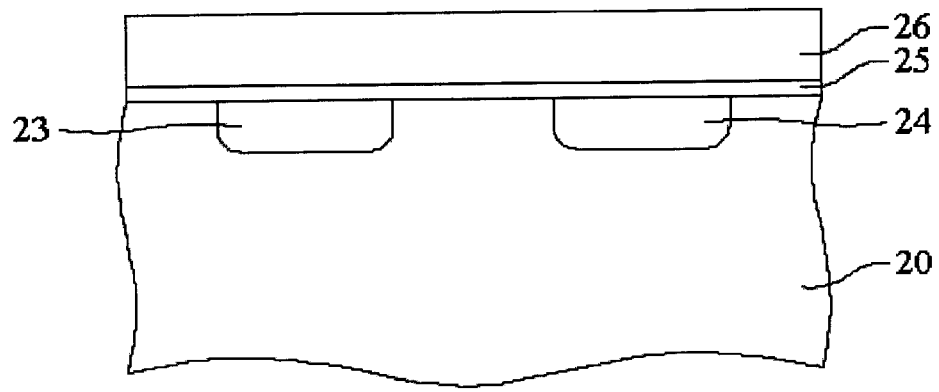
Figure 2C:
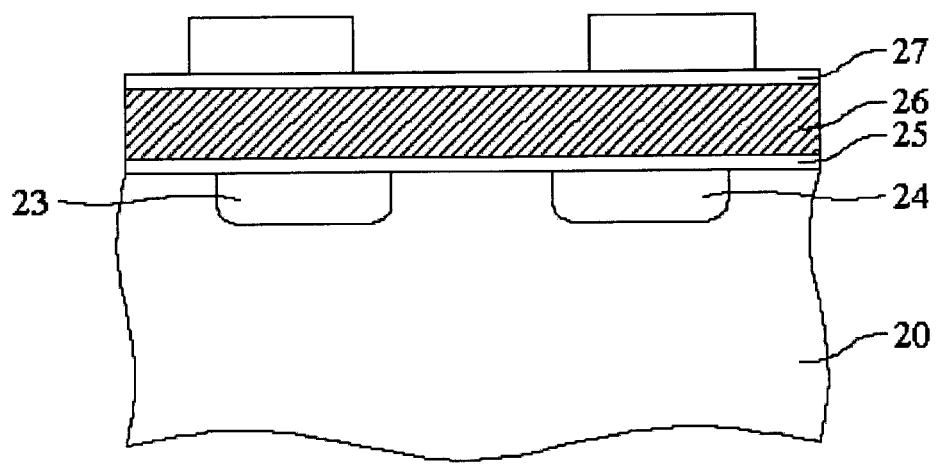
Figure 2D:
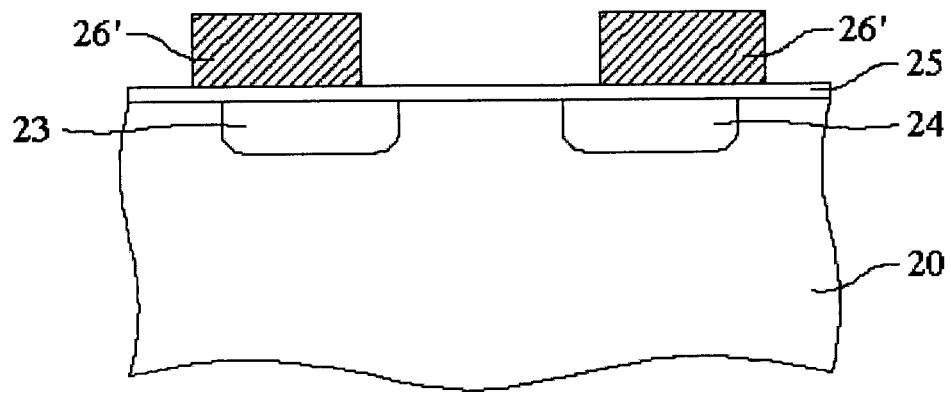
Figure 2E:
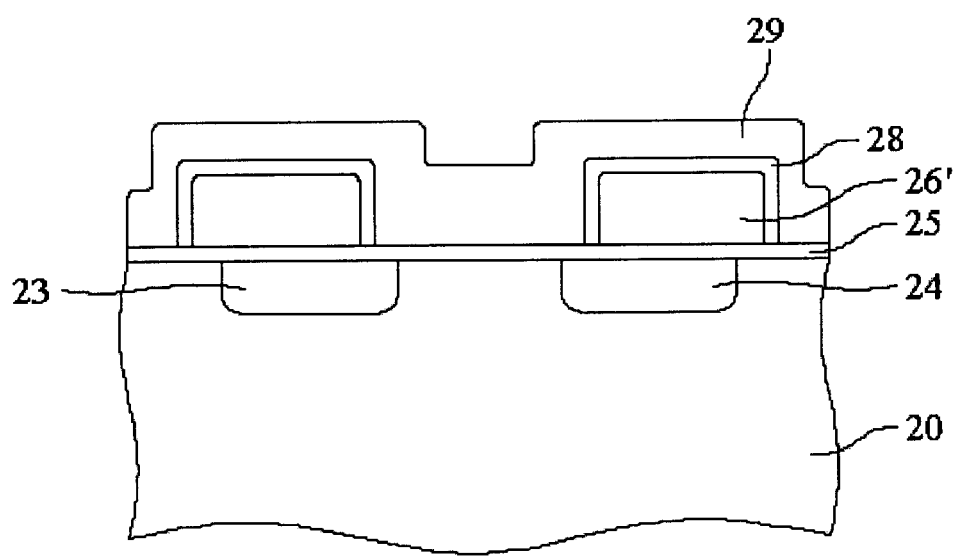
Figure 3A:
FIGS. 3A, 3B, 3C, 3D, 3E, 3F, 3G and 3H, shows cross-sectional views depicting the steps of a manufacturing a split-gate flash memory cell, according to one embodiment of the present invention.

Referring now to FIG. 3A, an active area 31 is formed on a p-type semiconductor substrate 30 by any known device isolation process such as local oxidation of silicon (LOCOS) or shallow trench isolation (STI). A buffer oxide layer 32 having a thickness of about 200 angstroms is formed on the semiconductor substrate 30 by conventional chemical vapor deposition (CVD) process.

Figure 3B:
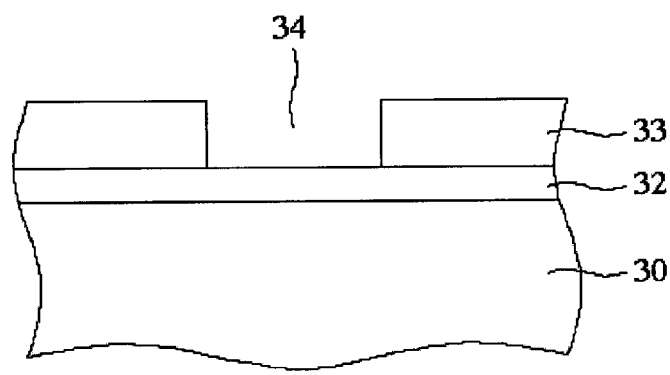

Referring to FIG. 3B, a dielectric layer 33 is deposited on the buffer oxide layer 32. The dielectric layer 33 includes silicon nitride having a thickness of, for example, 2,000 angstroms. A known photolithographic process is performed to remove part of silicon nitride layer 33 and form an opening 34.

Figure 3C:
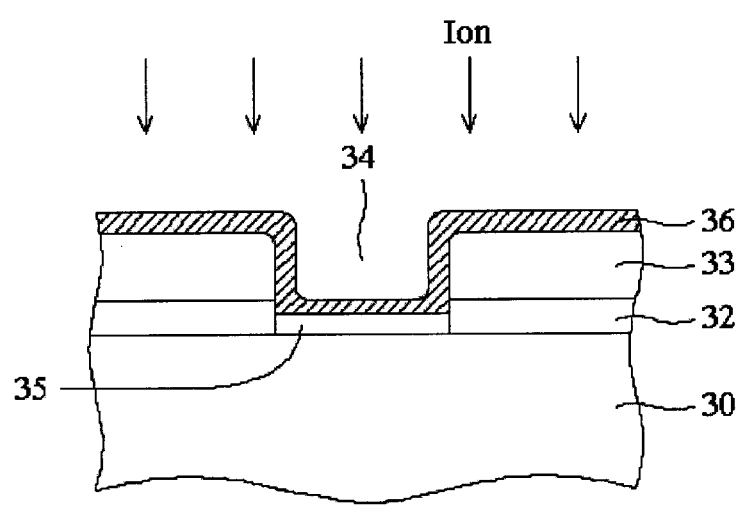

Referring to FIG. 3C, the buffer oxide layer 32 within the opening 34 is removed. A thin oxide layer of a thickness of about 80 angstroms is thermally grown on the substrate 30 to form a gate insulation layer 35. Then, polysilicon or amorphous silicon 36 of an appropriate thickness is deposited on the silicon nitride layer 33 and the oxide layer 35, and being doped with a suitable impurity to further serve as floating gates.

Figure 3D:
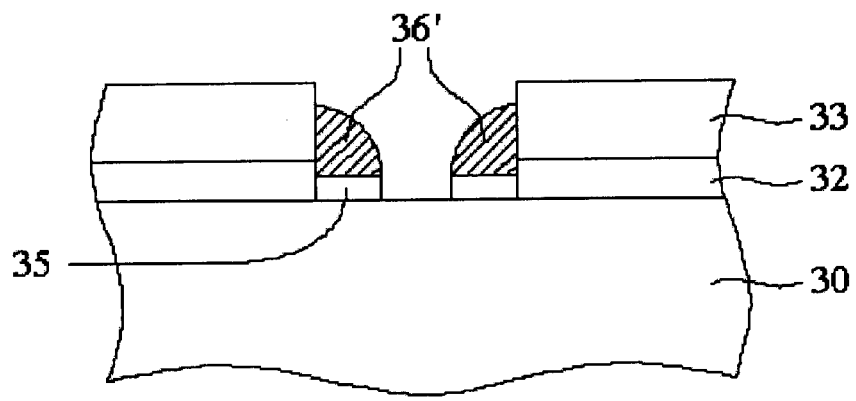

Referring FIG. 3D, part of the silicon layer 36 is dry etched anisotropically. The etching is stopped on the oxide layer 35 which is subsequently removed by wet etch. Sidewall spacer floating gates 36' are thus formed between the silicon nitride layer 33 and the semiconductor substrate 30. A source region 40 is formed in the substrate 30 by ion implantation.

Figure 3E:
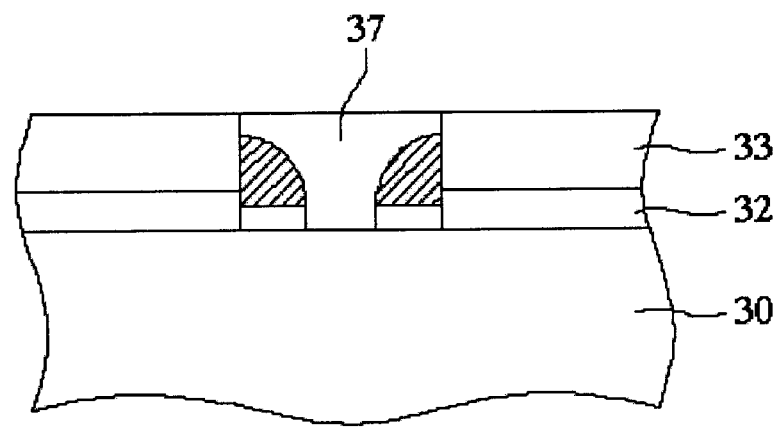

Referring to FIG. 3E, an oxide layer 37 is formed on the sidewall spacer floating gates 36' and the substrate 30, and excess oxide layer is then selectively removed by chemical mechanical polishing (CMP) method.

Figure 3F:
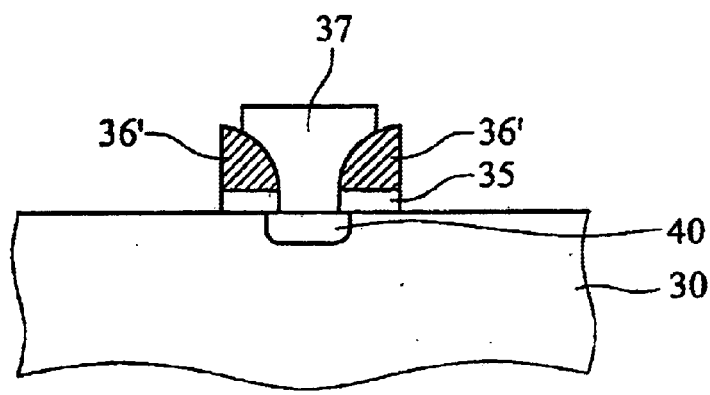
Figure 3G:
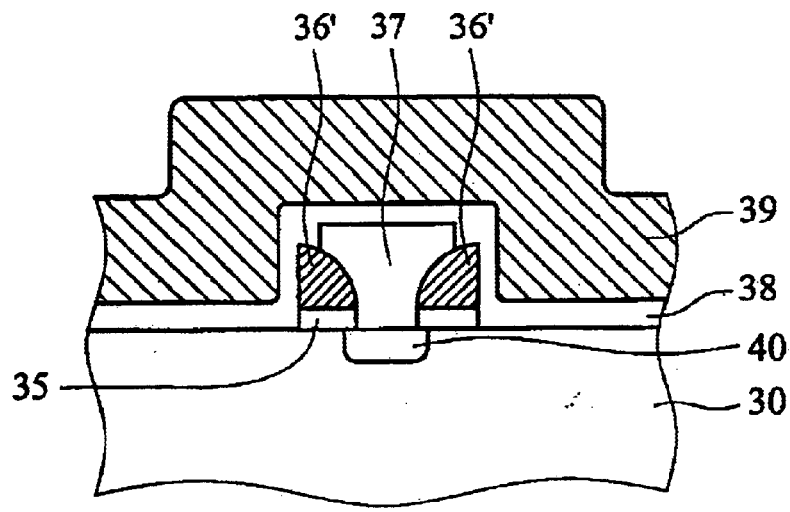
Figure 3H:
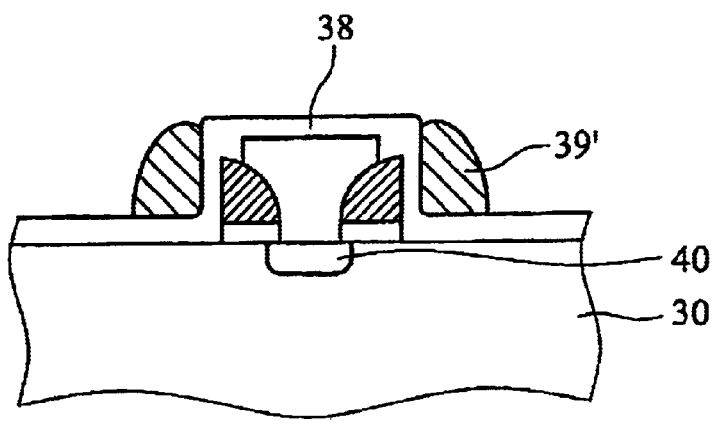

Referring to FIG. 3F, the silicon nitride layer 33 is removed by wet etch. Subsequently, the buffer oxide layer 32 outside the floating gates 36' is removed. After thermal oxidation at a temperature of 800 DEG C., an oxide layer 38 having a thickness from 150 angstroms to 250 angstroms is formed by CVD. A polysilicon layer 39 formed over the entire surface of the substrate 30 is anisotropically etched to remove part of the polysilicon layer 39. The remaining polysilicon layer 39 is doped with a suitable impurity to serve as control gates 39', as shown in FIG. 3G.

According to another embodiment of the present invention, after forming the sidewall spacer floating gates 36', a dielectric layer 41 is formed, as shown in FIG. 4A. The dielectric layer can be an oxide, a combination of oxide and silicon nitride (ON), or a combination of oxide, silicon nitride and oxide (ONO), the type of dielectric used depends upon the application. An isolation layer 41' is formed along the opposite sidewalls of the sidewall spacer floating gates 36' by etch. A doped polysilicon layer 42 is formed and etched back. As shown in FIG. 4B, an oxide layer 43 is formed, and the excess oxide layer is selectively removed by CMP. In subsequence, the control gates 40' will be formed in accordance with the process steps as shown in FIG. 3F through FIG. 3G.

Additional advantages and modifications will readily occur to those skilled in the art. Therefore, the invention in its broader aspect is not limited to the specific details, and illustrated example shown and described herein. Accordingly, various modifications may be made without departing from the spirit or scope of the general inventive concept as defined by the appended claims and their equivalents.

What is claimed is:

1. A method for manufacturing a self-aligned split-gate flash memory cell, comprising:
   providing a semiconductor substrate having an active region;
   forming a buffer isolation layer and a first dielectric layer sequentially overlying the semiconductor substrate;
   removal of part of the first dielectric layer and the buffer isolation layer to define an opening;
   forming a gate isolation layer on the bottom of the opening;
   forming a polysilicon layer conformally overlying the surface of a first dielectric layer and the opening;
   etching the polysilicon layer and the gate isolation layer to form sidewalls in the opening and to expose the semiconductor substrate between the sidewalls, wherein the sidewalls serve as floating gates;
   forming a source region in the semiconductor substrate between the floating gates;
   filling the opening with a second dielectric layer;
   removal of the first dielectric layer and the buffer isolation layer outside the floating gates;
   forming a third dielectric layer and a control gate layer overlying the surface of the semiconductor substrate sequentially and conformally; and
   self-alignment etching the control gate layer to form sidewalls as control gates outside the third dielectric layer.

2. The method as claimed in claim 1, wherein the polysilicon layer is self-aligned etched to form the sidewalls.

3. The method as claimed in claim 2, wherein the polysilicon layer is a conductive polysilicon layer.

4. The method as claimed in claim 3, wherein the conductive polysilicon layer is formed by performing an ion implantation to form a doped polysilicon layer.

5. The method as claimed in claim 3, wherein the conductive polysilicon layer is etched by anisotropic etching.

6. The method as claimed in claim 1, wherein the control gate layer is etched by anisotropic etching.

7. The method as claimed in claim 1, wherein the gate isolation layer is removed by wet etching.

8. The method as claimed in claim 1, wherein the thickness of the buffer isolation layer is approximately 50 angstroms to 500 angstroms.

9. The method as claimed in claim 1, wherein the thickness of the first dielectric layer is approximately 500 angstroms to 5,000 angstroms.

10. The method as claimed in claim 1, wherein the third dielectric layer comprises oxide.

11. A method for manufacturing a self-aligned split-gate flash memory cell, comprising:
    providing a semiconductor substrate having an active region;
    forming a buffer isolation layer and a first dielectric layer sequentially overlying the semiconductor substrate;
    removal of part of the first dielectric layer arid the buffer isolation layer to define an opening;
    forming a gate isolation layer on the bottom of the opening;
    forming a polysilicon layer conformally overlying the surface of a first dielectric layer and the opening;
    self-alignment etching the polysilicon layer and the gate isolation layer to form sidewalls in the opening and to expose the semiconductor substrate between the sidewalls, wherein the sidewalls serve as floating gates;
    forming a source region in the semiconductor substrate between the floating gates;
    filling the opening with a second dielectric layer;
    removal of the first dielectric layer and the buffer isolation layer outside the floating gates;
    forming a third dielectric layer and a control gate layer overlying the surface of the semiconductor substrate sequentially and conformally; and
    self-alignment etching the control gate layer to form sidewalls as control gates outside the third dielectric layer.

12. The method as claimed in claim 11, wherein the polysilicon layer is a conductive polysilicon layer.

13. The method as claimed in claim 12, wherein the conductive polysilicon layer is formed by performing an ion implantation to form a doped polysilicon layer.

14. The method as claimed in claim 12, wherein the conductive polysilicon layer is etched by anisotropic etching.

15. The method as claimed in claim 11, wherein the control gate layer is etched by anisotropic etching.

16. The method as claimed in claim 11, wherein the gate isolation layer is removed by wet etching.

17. The method as claimed in claim 11, wherein the thickness of the buffer isolation layer is approximately 50 angstroms to 500 angstroms.

18. The method as claimed in claim 11, wherein the thickness the first dielectric layer is approximately 500 angstroms to 5,000 angstroms.

19. The method as claimed in claim 11, wherein the third dielectric layer comprises oxide.

* * * * *